US012592368B2

(12) United States Patent
Park et al.

(10) Patent No.: US 12,592,368 B2
(45) Date of Patent: Mar. 31, 2026

(54) SUBSTRATE PROCESSING APPARATUS AND METHOD

(71) Applicant: SEMES CO., LTD., Chungcheongnam-do (KR)

(72) Inventors: Sunjoo Park, Chungcheongnam-do (KR); Hyunjong Shim, Chungcheongnam-do (KR); Sangmin Mun, Chungcheongnam-do (KR); Kyungseok Min, Chungcheongnam-do (KR); Hwan Jung, Chungcheongnam-do (KR); Nayeon Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 302 days.

(21) Appl. No.: 18/113,158

(22) Filed: Feb. 23, 2023

(65) Prior Publication Data

US 2023/0317435 A1 Oct. 5, 2023

(30) Foreign Application Priority Data

Apr. 1, 2022 (KR) ........................ 10-2022-0041227

(51) Int. Cl.
*H01J 37/32* (2006.01)
*G01J 3/443* (2006.01)
(Continued)

(52) U.S. Cl.
CPC ......... *H01J 37/32807* (2013.01); *G01J 3/443* (2013.01); *H01J 37/32724* (2013.01);
(Continued)

(58) Field of Classification Search
None
See application file for complete search history.

(56) References Cited

U.S. PATENT DOCUMENTS 10,921,251 B2    2/2021  Larsson
2013/0084707 A1*  4/2013  Hashimoto ....... H01J 37/32724
                                                          438/710
(Continued)

FOREIGN PATENT DOCUMENTS

KR          10-0837625 B1    6/2008
KR   10-2016-0134577 A     11/2016
(Continued)

OTHER PUBLICATIONS

Korean Office Action issued on Mar. 7, 2024 in corresponding KR Patent Application No. 10-2022-0041227, with English translation.
(Continued)

*Primary Examiner* — Kaj K Olsen
*Assistant Examiner* — Pradhuman Parihar
(74) *Attorney, Agent, or Firm* — Carter, DeLuca & Farrell LLP

(57) ABSTRACT

Provided is a substrate processing apparatus including a chamber having a processing space therein, a supporting unit arranged in the processing space, having a substrate located thereon, and including a label material layer including a label material therein, a plasma source configured to generate plasma from a processing gas in the processing space, and a measurement apparatus configured to detect the label material, wherein, when the supporting unit is etched to a depth that is greater than or equal to a first depth, the label material layer is exposed.

14 Claims, 11 Drawing Sheets

(51) Int. Cl.
     H01L 21/3065      (2006.01)
     H01L 21/683       (2006.01)

(52) U.S. Cl.
     CPC ..... *H01J 37/32862* (2013.01); *H01J 37/3288*
           (2013.01); *H01J 2237/334* (2013.01); *H01J*
        *2237/335* (2013.01); *H01L 21/3065* (2013.01);
                        *H01L 21/6833* (2013.01)

(56)             References Cited

U.S. PATENT DOCUMENTS

| | | | |
|---|---|---|---|
| 2016/0336149 A1* | 11/2016 | Larsson | ............ H01J 37/32467 |
| 2018/0052104 A1* | 2/2018 | Larsson | ............ H01J 37/32697 |
| 2021/0225619 A1* | 7/2021 | Suzuki | ................ H01L 21/683 |
| 2022/0208591 A1* | 6/2022 | Long | ................ H01L 21/67109 |

FOREIGN PATENT DOCUMENTS

| | | |
|---|---|---|
| KR | 20-2018-0000605 U | 3/2018 |
| KR | 10-2019-0032969 A | 3/2019 |
| KR | 10-2020-0051087 A | 5/2020 |

OTHER PUBLICATIONS

Korean Notice of Allowance issued on Oct. 30, 2024 in corresponding KR Patent Application No. 10-2022-0041227, with English translation.

\* cited by examiner

60

62     61

SUBSTRATE PROCESSING APPARATUS AND METHOD

CROSS-REFERENCE TO RELATED APPLICATION

This application is based on and claims priority under 35 U.S.C. § 119 to Korean Patent Application No. 10-2022-0041227, filed on Apr. 1, 2022, in the Korean Intellectual Property Office, the disclosure of which is incorporated by reference herein in its entirety.

BACKGROUND

1. Field

The disclosure relates to a substrate processing apparatus, and more particularly, to a substrate processing apparatus using plasma.

2. Description of the Related Art

In order to manufacture semiconductor devices, various processes such as photolithography, etching, ashing, ion implantation, thin film deposition, and cleaning are performed on substrates to form desired patterns on the substrates. From among these processes, the etching process is a process of removing a selected heating region from among layers formed on a substrate, and wet etching and dry etching are used as etching processes.

From among the etching processes, an etching apparatus using plasma is used for dry etching. In general, an electromagnetic field is formed in an internal space of a chamber to form plasma, and the electromagnetic field excites a processing gas provided in the chamber into a plasma state.

Plasma refers to an ionized gas state including ions, electrons, radicals, or the like. Plasma is generated by a very high temperature, a strong electric field, or a radio frequency (RF) electromagnetic field. In a semiconductor device manufacturing process, an etching process is performed by using plasma. The etching process is performed by colliding ionic particles included in plasma with a substrate.

SUMMARY

Provided is a substrate processing apparatus having reduced maintenance costs.

Additional aspects will be set forth in part in the description which follows and, in part, will be apparent from the description, or may be learned by practice of the presented embodiments of the disclosure.

According to an aspect of the disclosure, a substrate processing apparatus includes a chamber having a processing space therein, a supporting unit arranged in the processing space, having a substrate located thereon, and including a label material layer including a label material therein, a plasma source configured to generate plasma from a processing gas in the processing space, and a measurement apparatus configured to detect the label material, wherein, when the supporting unit is etched to a depth that is greater than or equal to a first depth, the label material layer is exposed.

Whether or not to replace the supporting unit may be determined according to whether or not the measurement apparatus detects the label material.

The supporting unit may include an electrostatic chuck.

The label material may include a material that is different from the processing gas.

The processing gas may include a gas for dry cleaning.

The gas for dry cleaning may include at least one selected from the group consisting of $C_4H_6$, $C_4F_8$, $CH_2F_2$, and $O_2$.

The label material may include at least one selected from the group consisting of Helium (He) and Neon (Ne).

A wavelength emitted by the label material may not overlap a wavelength band emitted by the processing gas.

The label material may include a material that does not react with the processing gas.

The label material layer may have a shape extending in parallel with a first surface of the supporting unit having the substrate located thereon.

The supporting unit may include a plurality of cooling gas holes therein, and the plurality of cooling gas holes may extend through the label material layer.

The measuring apparatus may include an analysis unit configured to receive light and analyze a wavelength of the light, and a determination unit configured to determine whether or not light in a particular wavelength band is detected from the wavelength analyzed by the analysis unit.

The measurement apparatus may include an optical emission spectroscopy.

According to another aspect of the disclosure, a substrate processing apparatus includes a chamber having a processing space therein, a supporting unit arranged in the processing space, supporting a substrate, and including a label material layer buried therein, a plasma source configured to generate plasma from a processing gas in the processing space, and a measurement apparatus configured to detect a label material, wherein the label material layer is exposed by etching of the supporting unit, and, when the measurement apparatus detects the label material, a process is stopped, and the supporting unit is replaced.

The supporting unit may include an electrostatic chuck.

The processing gas may include a gas for dry cleaning, and the label material may include at least one selected from the group consisting of Helium (He) and Neon (Ne).

The measuring may includes an analysis unit configured to receive light and analyze a wavelength of the light, and a determination unit configured to determine whether or not light in a particular wavelength band is detected from the wavelength analyzed by the analysis unit.

According to another aspect of the disclosure, a substrate processing method includes bringing a substrate into a processing space, and mounting the substrate on a supporting unit including a label material layer buried therein, performing a process for processing the substrate, taking the substrate, which has undergone the process, out from the processing space, cleaning the supporting unit, and determining a replacement time of the supporting unit, wherein the determining whether or not to replace the supporting unit includes, when the label material layer is exposed by etching of the supporting unit, determining that the replacement time of the supporting unit has arrived.

The supporting unit may include an electrostatic chuck.

The label material layer may include at least one selected from the group consisting of Helium (He) and Neon (Ne).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
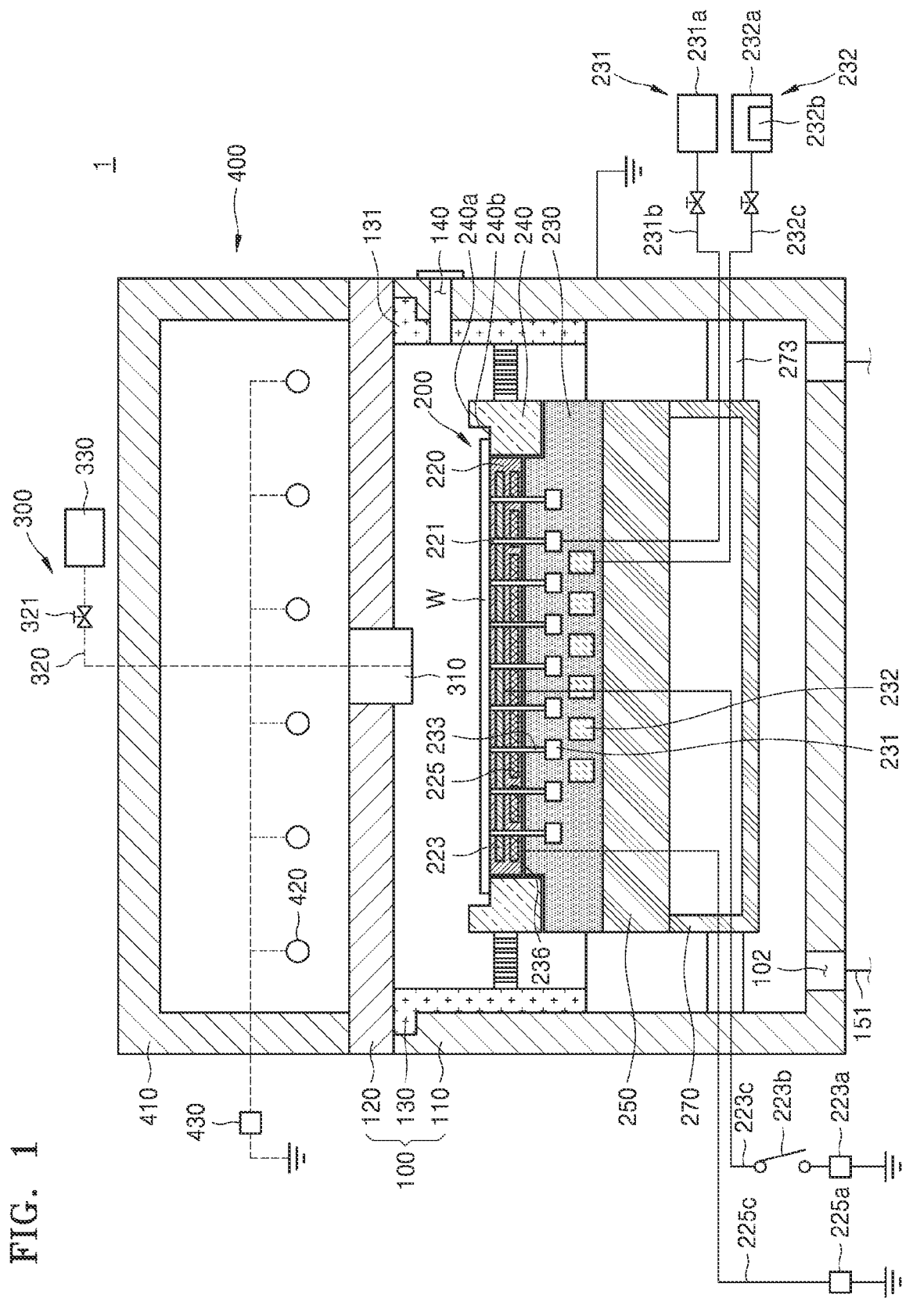
FIG. 1 is a cross-sectional view illustrating a general substrate processing apparatus.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Advantages and features of the disclosure and methods for achieving the same will become apparent with reference to the embodiments described below in detail together with the accompanying drawings. The disclosure may, however, be embodied in many different forms and should not be construed as being limited to the embodiments set forth herein; rather, these embodiments are provided so that the disclosure will be thorough and complete, and will fully convey the concept of the disclosure to those skilled in the art, and the disclosure will be defined by the scope of claims. Like reference numerals refer to like elements throughout.

When elements or layers are referred to as being "above" or "on" another element or layer, they may be directly on the other element or layer, or intervening elements or layers may be present. In contrast, when elements or layers are referred to as being "directly on" or "directly above" another element or layer, there are no intervening elements or layers present.

Spatially relative terms, such as "below," "beneath," "lower," "above," "upper," and the like, may be used herein for ease of description to describe one element or components' relationship to another element or components as illustrated in the figures. It will be understood that the spatially relative terms are intended to encompass different orientations of an element in use or operation in addition to the orientation depicted in the figures. For example, if the element in the figures is turned over, an element described as "below" or "beneath" other element would then be oriented "above" the other element. Thus, the example term "below" may encompass both an orientation of above and below. The element may be otherwise oriented and the spatially relative descriptors used herein may be interpreted accordingly.

Although the terms first, second, etc. may be used herein to describe various elements, components, and/or sections, these elements, components, and/or sections should not be limited by these terms. These terms are only used to distinguish one element, component, or sections from another element, component, or sections. Thus, a first element, a first component, or a first section discussed below may be termed a second element, a second component, or a second section without departing from the teachings of the disclosure.

The terminology used herein is for the purpose of describing embodiments only and is not intended to be limiting of the disclosure. As used herein, the singular forms are intended to include the plural forms as well, unless the context clearly indicates otherwise. The terms "comprises" and/or "comprising" when used herein, specify the presence of stated components, steps, operations, and/or elements, but do not preclude the presence or addition of one or more other components, steps, operations, and/or elements.

Unless otherwise defined, all terms (including technical and scientific terms) used herein have the same meaning as commonly understood by one of ordinary skill in the art to which the disclosure belong. Also, terms, such as those defined in commonly used dictionaries, will not be interpreted in an idealized or overly formal sense unless expressly so defined herein.

Hereinafter, embodiments will be described in detail with reference to the accompanying drawings, and, when the same or corresponding components are described with reference to the accompanying drawings, they will be given the same reference numerals regardless of reference numerals in the drawings and the same descriptions thereof will be omitted.

In an embodiment, a substrate processing apparatus for etching a substrate by using plasma will be described. However, the disclosure is not limited thereto, and may be applied to various types of apparatuses demanding measurement of the degree of damage of components inside a chamber.

FIG. 1 is a cross-sectional view illustrating a general substrate processing apparatus.

Referring to FIG. 1, a substrate processing apparatus 1 processes a substrate W by using plasma. For example, the substrate processing apparatus 1 may perform an etching process on the substrate W. The substrate processing apparatus 1 includes a chamber unit 100, a support unit 200, a gas supply unit 300, a plasma source unit 400, and a measurement unit (not shown).

The chamber unit 100 has a processing space for processing the substrate W. The chamber unit 100 includes a cup 110, a cover 120, and a liner 130.

The cup 110 has a space with an open top therein. The internal space of the cup 110 is provided as a processing space in which a substrate processing process is performed. The cup 110 includes a metal material. The cup 110 may include an aluminum material.

The cup 110 may be grounded. An exhaust hole 102 is formed in a bottom surface of the cup 110. The exhaust hole 102 is connected to an exhaust line 151. Reaction byproducts generated during a process and a gas remaining in the internal space of the cup 110 may be discharged to the outside via the exhaust line 151. The inside of the cup 110 is depressurized to certain pressure by an exhaust process.

The cover 120 covers the open top of the cup 110. The cover 120 is provided in a plate shape and seals the internal space of the cup 110. The cover 120 may include a dielectric substance window.

The liner 130 is provided inside the cup 110. The liner 130 has an internal space with an open top and bottom. The liner 130 may be provided in a cylindrical shape. The liner 130 may have a radius corresponding to an inner side surface of the cup 110. The liner 130 is provided along the inner side surface of the cup 110. A support ring 131 is formed at a top end of the liner 130. The support ring 131 is provided as a ring-shaped plate and protrudes outside the liner 130 along a circumference of the liner 130. The support ring 131 is located on a top end of the cup 110, and supports the liner 130. The liner 130 may include the same material as the cup 110. The liner 130 may include an aluminum material. The liner 130 protects the inner side surface of the cup 110. Arc discharge may occur inside the chamber unit 100 while a processing gas is excited. The arc discharge damages peripheral apparatuses. The liner 130 protects the inner side surface of the cup 110 to prevent the inner side surface of the cup 110 from being damaged by the arc discharge. In addition, the liner 130 prevents reaction by-products generated during a substrate processing process from being deposited on an inner wall of the cup 110. The liner 130 is cheaper and easier to replace than the cup 110. Accordingly, when the liner 130 is damaged by arc discharge, a worker may replace the liner 130 with a new liner.

The support unit 200 supports the substrate W within the processing space inside the chamber unit 100. For example, the support unit 200 is arranged inside the cup 110. The support unit 200 supports the substrate W. The support unit 200 may include an electrostatic chuck that adsorbs the substrate W by using an electrostatic force. Alternatively, the support unit 200 may support the substrate W in various ways, such as mechanical clamping. Hereinafter, the support unit 200 including the electrostatic chuck will be described.

The support unit 200 includes the electrostatic chuck and a lower cover 270. The support unit 200 may be provided inside the chamber unit 100 to be spaced apart from a bottom surface of the cup 110 upwards.

The electrostatic chuck has a support plate and an insulating plate 250. The support plate includes an internal dielectric plate 220, an electrode 223, a heater 225, a flow path forming plate 230, and an edge ring 240. The substrate W is located on the support plate.

The internal dielectric plate 220 is located at an upper end portion of the electrostatic chuck. The internal dielectric plate 220 includes a disk-shaped dielectric substance. The substrate W is located on a top surface of the internal dielectric plate 220. The top surface of the internal dielectric plate 220 has a smaller radius than the substrate W. The internal dielectric plate 220 has formed therein a first supply flow path 221 used as a passage through which a heat transfer gas is supplied to a bottom surface of the substrate W. The electrode 223 and the heater 225 are buried in the internal dielectric plate 220.

The electrode 223 is located above the heater 225. The electrode 223 is electrically connected to a first lower power source 223a. An electrostatic force acts between the electrode 223 and the substrate W by a current applied to the electrode 223, and the substrate W is adsorbed onto the internal dielectric plate 220 by the electrostatic force.

The heater 225 is electrically connected to a second lower power source 225a. The heater 225 generates heat by resisting a current applied from the second lower power source 225a. The generated heat is transferred to the substrate W through the internal dielectric plate 220. The substrate W is maintained at a certain temperature by the heat generated by the heater 225. The heater 225 includes a coil having a spiral shape. The flow path forming plate 230 is located beneath the internal dielectric plate 220. A bottom surface of the internal dielectric plate 220 and a top surface of the flow path forming plate 230 may be bonded to each other by an adhesive 236.

The flow path forming plate 230 includes formed therein a first circulation flow path 231, a second circulation flow path 232, and a second supply flow path 233. The first circulation flow path 231 is provided as a passage through which a heat transfer gas circulates. The second circulation flow path 232 is provided as a passage through which a cooling fluid circulates. The second supply flow path 233 connects the first circulation flow path 231 to the first supply flow path 221. The first circulation flow path 231 may be formed in a spiral shape inside the flow path forming plate 230. Alternatively, the first circulation flow path 231 may be arranged such that ring-shaped flow paths having different radiuses have the same center. The first circulation flow paths 231 may communicate with each other. The first circulation flow paths 231 are formed at the same height.

The first circulation flow path 231 is connected to a heat transfer medium storage unit 231a via a heat transfer medium supply line 231b. A heat transfer medium is stored in the heat transfer medium storage unit 231a. The heat transfer medium includes an inert gas. According to an embodiment, the heat transfer medium includes a helium (He) gas. The helium gas is supplied to the first circulation flow path 231 via the heat transfer medium supply line 231b, and is supplied to the bottom surface of the substrate W by sequentially passing through the second supply flow path 233 and the first supply flow path 221. The helium gas operates as a medium to help heat exchange between the substrate W and the electrostatic chuck. Accordingly, the temperature of the substrate W is maintained uniform as a whole.

The second circulation flow path 232 is connected to a cooling fluid storage unit 232a via a cooling fluid supply line 232c. A cooling fluid is stored in the cooling fluid storage unit 232a. A cooler 232b may be provided in the cooling fluid storage unit 232a. The cooler 232b cools the cooling fluid to a certain temperature. Alternatively, the cooler 232b may be installed on the cooling fluid supply line 232c. The cooling fluid supplied to the second circulation flow path 232 via the cooling fluid supply line 232c circulates along the second circulation flow path 232, and cools the flow path forming plate 230. As being cooled, the flow path forming plate 230 cools the internal dielectric plate 220 and the substrate W together to maintain the substrate W at a certain temperature.

The edge ring 240 is arranged in an edge region of the electrostatic chuck. The edge ring 240 has a ring shape, and is provided to surround the support plate. For example, the edge ring 240 is arranged along a circumference of the internal dielectric plate 220 to support an edge region of the substrate W. The edge ring 240 is provided such that an upper edge region thereof protrudes in a ring shape, and thus induces plasma to be concentrated on the substrate W. The insulating plate 250 is located underneath the flow path forming plate 230. The insulating plate 250 includes an insulating material, and electrically insulates the flow path forming plate 230 from the lower cover 270.

The lower cover 270 is located at a lower end portion of the support unit 200. The lower cover 270 is located to be spaced apart from the bottom surface of the cup 110 upwards. The lower cover 270 has formed therein a space with an open top. The top of the lower cover 270 is covered by the insulating plate 250. Therefore, an outer radius of a cross section of the lower cover 270 may be provided to have the same length as an outer radius of the insulating plate 250. The internal space of the lower cover 27 may have located therein a lift pin module and the like that receive, from an external conveying unit, the substrate W being returned and settles the received substrate W on the support plate.

The lower cover 270 has a connection unit 273. The connection unit 273 connects an outer surface of the lower cover 270 to the inner sidewall of the cup 110. A plurality of connection units 273 may be provided on the outer surface of the lower cover 270 at regular intervals. The connection unit 273 supports the support unit 200 inside the chamber unit 100. In addition, the connection unit 273 is connected to the inner wall of the cup 110 so that the lower cover 270 is electrically grounded. A first power line 223c connected to the first lower power source 223a, a second power line 225c connected to the second lower power source 225a, the heat transfer medium supply line 231b connected to the heat transfer medium storage unit 231a, the cooling fluid supply line 232c connected to the cooling fluid storage unit 232a, and the like extend into the lower cover 270 through the internal space of the connection unit 273.

The gas supply unit 300 supplies a processing gas into the processing space inside the chamber unit 100. The gas supply unit 300 includes a gas supply nozzle unit 310, a gas supply line unit 320, and a gas storage unit 330. The gas supply nozzle unit 310 is installed in a central portion of the cover 120. A feeding hole is formed in a bottom surface of the gas supply nozzle unit 310. The feeding hole is located under the cover 120, and supplies a processing gas into the chamber unit 100. The gas supply line unit 320 connects the gas supply nozzle unit 310 and the gas storage unit 330 to each other. The gas supply line unit 320 supplies the processing gas stored in the gas storage unit 330 to the gas supply nozzle unit 310. A valve unit 321 is installed at the gas supply line unit 320. The valve unit 321 opens and closes the gas supply line unit 320, and adjusts a flow rate of a processing gas supplied through the gas supply line unit 320.

The gas storage unit 330 may supply, as a processing gas, an etching gas used for processing the substrate W. The gas storage unit 330 may supply a gas including a fluorine component as an etching gas. For example, the gas storage unit 330 may supply a gas, such as $SF_6$ and/or $CF_4$.

Meanwhile, the gas supply unit 300 may further include a gas storage unit (not shown) for supplying a deposition gas. The gas supply unit 300 may supply, for example, a gas, such as $C_4F_8$ and/or $C_2F_4$, as a deposition gas.

A single gas storage unit 330 may be provided to supply an etching gas to a shower head unit (not shown) having a plurality of gas feeding holes, to feed a gas into the chamber unit 100. However, the present embodiment is not limited thereto. A plurality of gas storage units 330 may be provided to supply a processing gas to the shower head unit.

The plasma source unit 400 generates plasma from a gas remaining in a discharge space. Here, the discharge space refers to a space located above the support unit 200 in the internal space of the chamber unit 100. For example, the plasma source unit 400 generates plasma from a processing gas supplied into the processing space inside the chamber unit 100. The plasma source unit 400 is provided outside the processing space of the chamber unit 100. According to an embodiment, an inductively coupled plasma (ICP) source may be used as the plasma source unit 400. However, the present embodiment is not limited thereto. The plasma source unit 400 may generate plasma in the discharge space inside the chamber unit 100 by using a capacitively coupled plasma (CCP) source. The plasma source unit 400 includes an antenna chamber 410, an antenna 420, and a plasma power source 430. The antenna chamber 410 is provided in a cylindrical shape with an open bottom. The antenna chamber 410 is provided with a space therein. The antenna chamber 410 is provided to have a diameter corresponding to the chamber unit 100. A lower end of the antenna chamber 410 is provided to be detachable from the cover 120. The antenna 420 is arranged inside the antenna chamber 410. The antenna 420 is provided as a spiral coil that is wound a plurality of times, and is connected to the plasma power source 430. The antenna 420 receives power from the plasma power source 430. The plasma power source 430 may be located outside the chamber unit 100. The antenna 420 to which power is applied may form an electromagnetic field in the processing space of the chamber unit 100. A processing gas is excited into a plasma state by the electromagnetic field.

Figure 2:
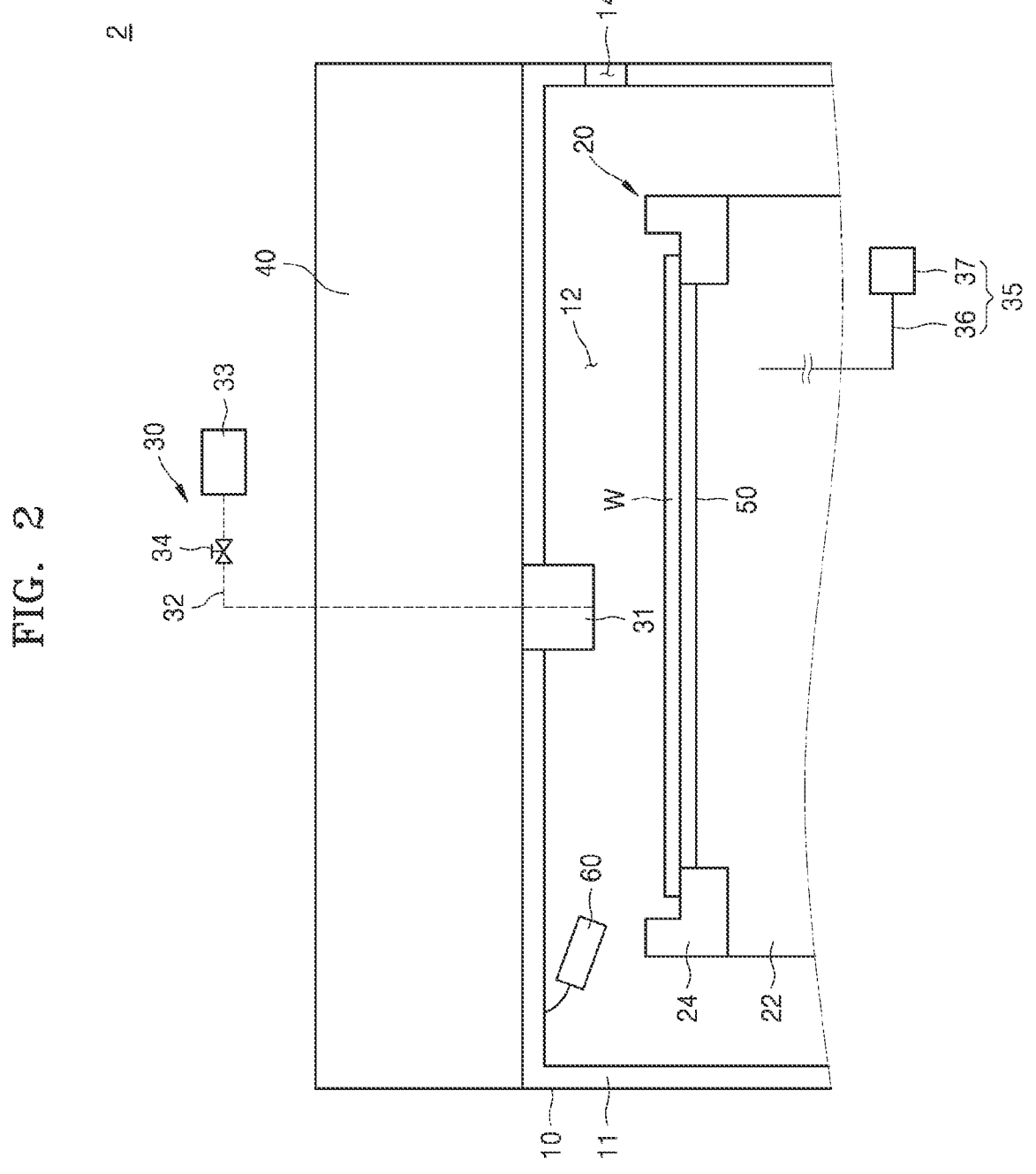
FIG. 2 is a cross-sectional view schematically illustrating a substrate processing apparatus according to an embodiment.

FIG. 2 is a cross-sectional view schematically illustrating a substrate processing apparatus according to an embodiment.

Referring to FIG. 2, a substrate processing apparatus 2 processes a substrate W by using plasma. For example, the substrate processing apparatus 2 may process the substrate W by using a dry etching process. However, the description of the processing is only an example, and the substrate processing apparatus 2 may process the substrate W by using another process rather than the dry etching process.

The substrate processing apparatus 2 includes a chamber 10, a supporting unit 20, a first gas supply unit 30, a second gas supply unit 35, a plasma source 40, and a measurement apparatus 60.

The chamber 10 may include a housing 11, a processing space 12, and a substrate gateway 14. The processing space 12 in which a substrate processing process is performed is provided inside the housing 11. The housing 11 includes a metal material. The housing 11 may include an aluminum material. The housing 11 may be electrically grounded. Although not shown, an exhaust hole (not shown) connected to an exhaust line (not shown) may be formed in a bottom surface of the housing 11. Reaction by-products generated during a process, a gas remaining in an internal space of the housing 11, by-products removed during a cleaning process of the supporting unit 20, and the like may be emitted to the outside via the exhaust line. Accordingly, pressure in the processing space 12 may be adjusted.

The substrate W may be brought into the processing space 12 through the substrate gateway 14, and the substrate W, which undergoes a processing process, may be taken out through the substrate gateway 14. The substrate gateway 14 may be formed by passing through a sidewall of the housing 11. A door (not shown) for opening and closing the substrate gateway 14 is provided on an outer surface of the housing 11 facing the substrate gateway 14.

The supporting unit 20 may include a support plate 22 and a focus ring 24. The supporting unit 20 supports the substrate W in the processing space 12 inside the chamber 10. For example, the supporting unit 20 is arranged inside the housing 11 of the chamber 10. The supporting unit 20 supports the substrate W. In one embodiment, the substrate W is located on the support plate 22. The supporting unit 20 may include an electrostatic chuck that adsorbs the substrate W by using an electrostatic force. Hereinafter, the supporting unit 20 including the electrostatic chuck will be described.

The focus ring 24 is arranged in an edge region of the supporting unit 20, and is provided to surround the support plate 22. In an embodiment, the focus ring 24 may have a ring shape. For example, the focus ring 24 is arranged along a circumference of an internal dielectric plate (not shown) to support an edge region of the substrate W. The focus ring 24 is provided such that an upper edge region thereof protrudes in a ring shape, and thus induces plasma to be concentrated on the substrate W.

A first gas supply unit 30 may include a first gas supply nozzle 31, a first gas supply line 32, a first gas storage unit 33, and a valve 34. The first gas supply unit 30 supplies a processing gas into the processing space 12 inside the chamber 10. The processing gas supplied by the first gas supply unit 30 into the processing space 12 inside the chamber 10 may be a processing gas used in a process of processing the substrate W.

The first gas supply nozzle 31 is installed on an upper portion of the housing 11. A feeding hole is formed in a bottom surface of the first gas supply nozzle 31. The feeding hole supplies the processing gas into the chamber unit 100. The first gas supply line 32 connects the first gas supply nozzle 31 and the first gas storage unit 33 to each other. The first gas supply line 32 supplies the processing gas stored in the first gas storage unit 33 to the first gas supply nozzle 31. The valve 34 is installed at the first gas supply line 32. The valve 34 opens and closes the first gas supply line 32, and adjusts a flow rate of the processing gas supplied via the first gas supply line 32.

The second gas supply unit 35 may include a second gas supply line 36 and a second gas storage unit 37. The second gas supply unit 35 may supply a processing gas used in a cleaning process of the supporting unit 20. The cleaning process of the supporting unit 20 may include a dry cleaning process. For example, the cleaning process of the supporting unit 20 may include an in-situ dry (ISD) cleaning process. In other words, the second gas supply unit 35 may supply a gas to remove impurities remaining on an edge portion of the support plate 22 or an upper portion of the focus ring 24. The second gas supply line 36 may be provided inside the support plate 22. Unlike the illustration in FIG. 2, the second gas supply line 36 may be provided between the support plate 22 and the focus ring 24. The second gas supply line 36 may be formed, for example, to be connected between the support plate 22 and the focus ring 24. Meanwhile, the second gas supply line 36 may be provided inside the focus ring 24, and may be bent to be connected between the support plate 22 and the focus ring 24.

The second gas supply unit 35 may supply $C_4H_6$, $C_4F_8$, $CH_2F_2$, and $O_2$, or the like as a processing gas for removing impurities. However, the present embodiment is not limited thereto. The second gas supply unit 35 may supply another gas, a cleaning agent, or the like.

The plasma source 40 generates plasma from a gas provided in a discharge space. Here, the discharge space refers to a space located above the supporting unit 20 in an internal space of the chamber 10. For example, the plasma source 40 generates plasma from a processing gas supplied by the first gas supply unit 30 into the processing space 12 inside the chamber 10. Alternatively, the plasma source 40 may generate plasma from a processing gas supplied by the second gas supply unit 35.

Referring to FIG. 2 continuously, the supporting unit 20 may further include therein a label material layer 50 including a label material. As illustrated in FIG. 2, the label material layer 50 may be formed inside the support plate 22. As described above, the supporting unit 20 may include an electrostatic chuck, and thus, the label material layer 50 may be formed by being buried within a certain depth of the electrostatic chuck of the supporting unit 20. Hereinafter, the supporting unit 20 including the electrostatic chuck will be described.

The label material layer 50 may be formed within a certain depth of the electrostatic chuck, and the certain depth may be a depth at which the electrostatic chuck may be maximally used. In other words, when the electrostatic chuck is etched deeper than a depth to which the label material layer 50 is formed, the electrostatic chuck may not be used. The certain depth of the electrostatic chuck formed by burying the label material layer 50 is an electrostatic chuck maximum usable depth, and may be set by a user by considering a process condition and environment.

As described above, a dry cleaning process may be used to clean the supporting unit 20, and etching of the electrostatic chuck may occur during this process. When etching of the electrostatic chuck occurs to a certain depth to which the label material layer 50 is buried, i.e., to the electrostatic chuck maximum usable depth, the label material layer 50 is exposed, and thus, the label material is exposed. Here, etching of the electrostatic chuck does not occur uniformly, and thus, only a portion of the label material layer 50 may be exposed. When the label material is exposed, the measurement apparatus 60 may detect the exposure of the label material. The measurement apparatus 60 may be an optical measurement apparatus. For example, the measurement apparatus 60 may determine whether or not the label material is detected, by analyzing a wavelength of the label material. When the label material is detected by the measurement apparatus 60, a process in progress may stop, and the supporting unit 20 may be replaced. In particular, the electrostatic chuck may be replaced.

In other words, the label material layer 50 is formed by burying the label material at the electrostatic chuck maximum usable depth inside the electrostatic chuck, and, when etching of the electrostatic chuck occurs by the cleaning process of the supporting unit 20, the label material is exposed at a last point in time when the electrostatic chuck is usable. For example, whether or not to replace the supporting unit 20, in particular, whether or not to replace the electrostatic chuck, may be determined according to whether or not the label material is exposed.

The label material layer 50 is formed by adding a label material to a certain depth from a top surface, i.e., an electrostatic chuck maximum usable depth, in a process of stacking a plurality of ceramic plates for forming the electrostatic chuck. In an embodiment, the label material layer 50 may be formed by doping a label material. In an embodiment, the electrostatic chuck used in the substrate processing apparatus 2 may be generally formed of a ceramic material, such as alumina, and may be manufactured in a form in which a plurality of ceramic plates are bonded to have an electrostatic electrode and a heater embedded therein. In other words, the electrostatic chuck may be manufactured as an assembly of a plurality of ceramic plates by sintering and bonding a plurality of ceramic plates manufactured by tape casting. The electrostatic electrode and the heater may be embedded in the electrostatic chuck by coating and forming electrostatic electrode and heater patterns before bonding the plurality of ceramic plates to one another. Here, before stacking and then sintering and bonding the plurality of ceramic plates, the label material layer 50 may be formed by adding a label material to a certain depth from the top surface.

In one embodiment, the electrostatic chuck including the label material layer 50 is adhered onto a metallic base plate including a refrigerant flow path via a bonding layer. The temperature of the substrate W adsorbed and fixed to the electrostatic chuck is adjusted by the heater included in the electrostatic chuck and the refrigerant flow path included in the base plate. A heat transfer gas, such as Helium (He), may be supplied toward a rear surface of the substrate W to transfer heat between the substrate W and the base plate, and accordingly, a gas supply hole for supplying the heat transfer gas may be formed in the base plate and the electrostatic chuck. In addition, an embossing pattern for providing a movement passage of the heat transfer gas supplied through the gas supply hole is formed on a surface of the electrostatic chuck contacting the rear surface of the substrate W. The embossing pattern on the surface of the electrostatic chuck may be formed by a surface processing method, such as bead blasting or sand blasting.

The label material, which is buried in the maximum usable depth of the electrostatic chuck, exposed during etching of the electrostatic chuck, and detected by the measurement apparatus 60, may be a material that is not used in a processing process for the substrate W, or may include a different material from the processing gas used in the processing process for the substrate W. Alternatively, the label material may be a material that is different from a material generated as a by-product during the processing process for the substrate W, or may include the material. In other words, when only a material used during a process is used as the label material, even though the label material is detected, whether or not the label material is exposed and detected by etching of the electrostatic chuck may not be determined. In an embodiment, a process material may be a processing gas used in an etching process for the substrate W. For example, the processing gas may be a gas, such as $SF_6$ and/or $CF_4$. In an embodiment, the process material may be a processing gas used in a deposition process for the substrate W. For example, the process material may be a gas, such as $C_4F_8$ and/or $C_2F_4$. In an embodiment, the process material may be a processing gas used in a cleaning process of the supporting unit 20. As described above, the supporting unit 20 may be cleaned by a dry cleaning process, and a processing gas may include, for example, $C_4H_6$, $C_4F_8$, $CH_2F_2$, and/or $O_2$. However, the processing gas is not limited thereto, and may include another gas or a cleaning agent supplied by the second gas supply unit 35 to remove impurities. In summary, the label material may include a material that is not used during a process, and thus may not be selected from the group consisting of $SF_6$, $CF_4$, $C_4F_8$, $C_2F_4$, $C_4H_6$, $CH_2F_2$, and $O_2$ that may be used during the process as described above. Alternatively, the label material may include a material that is not selected from the group consisting of $SF_6$, $CF_4$, $C_4F_8$, $C_2F_4$, $C_4H_6$, $CH_2F_2$, and $O_2$. Alternatively, the label material may include a material that is different from a by-product generated during a processing process for the substrate W. In addition, for the stability of the process, the label material does not produce a chemical reaction with processing gases or by-products thereof. In other words, the label material may be a process inert material. The label material may additionally include a lightweight element to facilitate detection by the measurement device 60. For example, the label material may be He and/or Ne, or may include He and/or Ne. However, the composition of the label material is only an example, and the spirit of the disclosure is not limited thereto.

As described above, the measurement apparatus 60 may be an optical measurement apparatus. For example, the measurement apparatus 60 may determine whether or not the label material is detected, by analyzing a wavelength of the label material. In an embodiment, the measurement apparatus 60 may include an optical emission spectroscopy (OES). Therefore, a wavelength emitted by the label material may not overlap a wavelength band emitted by a material used during a process. Alternatively, the label material may include a material emitting a wavelength in a wavelength band that does not overlap a wavelength band emitted by a material used during a process. As described above, one or more materials selected from the group consisting of $SF_6$, $CF_4$, $C_4F_8$, $C_2F_4$, $C_4H_6$, $CH_2F_2$, and $O_2$ may be used during a process, and thus, the label material may be or may include a material emitting a wavelength in a wavelength band that is not emitted by one or more materials selected from the group.

When forming the label material layer 50 including a label material that may be detected by the measurement apparatus 60 at the electrostatic chuck maximum usable depth inside the electrostatic chuck, the substrate processing apparatus 2, in which whether or not to replace the electrostatic chuck is determined according to whether or not a label material is detected, may be provided. When the label material layer 50 is not formed as in the disclosure, the electrostatic chuck may be preemptively replaced by predicting surface etching of the electrostatic chuck. In addition, a timing of determining the suspension of use of the electrostatic chuck due to over-etching of the surface of the electrostatic chuck may be distinguished by an increase in a level of backside cooling gas leakage. However, according to the distinguishment of the timing, quantitative analysis may not be performed, and a significant difference may occur according to a shape (e.g., a concave or convex shape) of the surface of the electrostatic chuck. Therefore, the cost increases due to preemptive replacement of the electrostatic chuck. However, when constructing the substrate processing apparatus 2 according to an embodiment, a clear point in time when the use of the electrostatic chuck is completed may be determined, and the electrostatic chuck may be allowed to be replaced at a final point in time when the electrostatic chuck is usable, thereby reducing the maintenance cost of a semiconductor manufacturing apparatus or the substrate processing apparatus 2.

As illustrated in FIG. 2, the label material layer 50 including the label material, which is formed inside the supporting unit 20, may have a plate shape extending parallel to a first surface (a top surface or bottom surface) of the supporting unit 20. For example, when viewed from a cross section of the supporting unit 20, the label material layer 50 may extend parallel to the top surface of the support plate 22 facing the substrate W, and a distance between the label material layer 50 and the top surface of the support plate 22 may be substantially uniform. However, the shape of the label material layer 50 is not limited thereto, and may extend not parallel to the first surface (the top surface or bottom surface) of the supporting unit 20. In an embodiment, the label material layer 50 may be formed by non-uniformly doping a label material. The non-uniform doping of the label material may occur due to a process problem.

Figure 3:
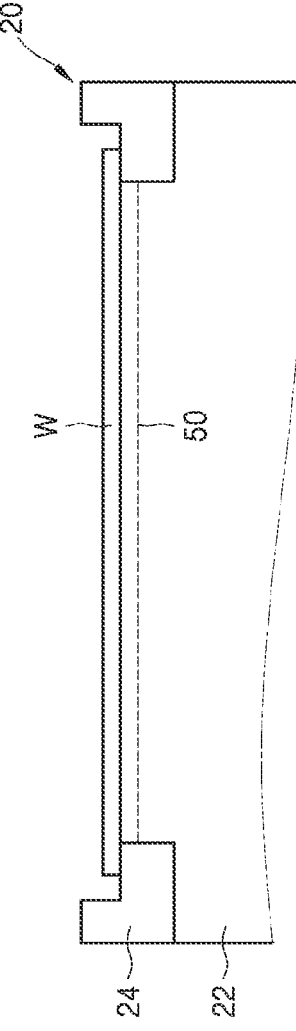
FIG. 3 is a cross-sectional view of a supporting unit provided in a substrate processing apparatus, according to an embodiment.
Figure 4:
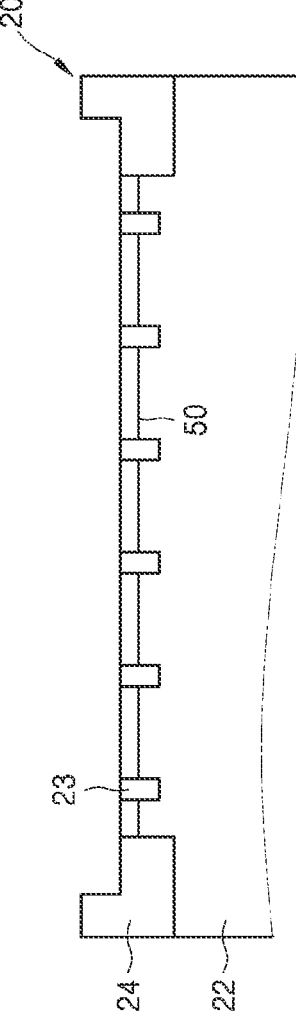
FIG. 4 is a cross-sectional view of a supporting unit provided in a substrate processing apparatus, according to an embodiment.

FIG. 3 is a cross-sectional view of a supporting unit provided in a substrate processing apparatus, according to an embodiment. FIG. 4 is a cross-sectional view of a supporting unit provided in a substrate processing apparatus, according to an embodiment.

Referring to FIG. 3, a label material layer 50 including a label material, which is formed inside a supporting unit 20, may be in the form of a straight line-shaped plate having a non-continuously extending cross section. In other words, the label material layer 50 may be a plate including a plurality of holes, which is formed by doping a label material at a low concentration. Here, a hole may not indicate that a hole is actually present inside an electrostatic chuck or a support plate 22. In other words, when a label material is doped at a sufficiently high concentration, another material constituting an existing electrostatic chuck may be located at a point (or height) at which the label material is formed, and thus, a local area in which a label material is not doped or is doped at a relatively low concentration may be defined as a hole. The definition of the hole may be due to a process issue or may be intended for process efficiency.

Referring to FIG. 4, a supporting unit 20 may further include a plurality of cooling gas holes 23 therein. In an embodiment, the cooling gas holes 23 may be holes through which a gas for cooling the substrate W located on the supporting unit 20 is supplied. In an embodiment, the cooling gas holes 23 may be connected to a cooling gas storage unit (not shown) to maintain the substrate W at a certain temperature. The plurality of cooling gas holes 23 may be formed in a top surface of a support plate 22 by extending in a direction perpendicular to the top surface of the support plate 22. The plurality of cooling gas holes 23 may be formed by extending to a point deeper than an electrostatic chuck maximum usable depth in which the label material layer 50 formed inside the electrostatic chuck is located. In this case, the cooling gas holes 23 may be constituted to pass through the label material layer 50. The passing of the cooling gas holes 23 through the label material layer 50 may indicate that the label material layer 50 is first formed, and then the cooling gas holes 23 are formed by passing through the label material layer 50 that is formed, but is not limited thereto. In an embodiment, the label material layer 50 may be formed by doping a label material while avoiding the cooling gas holes 23 that are formed.

Figure 5:
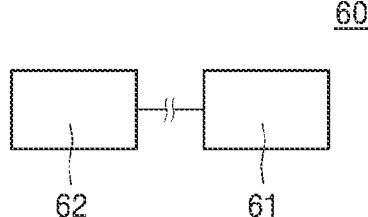
FIG. 5 is a side view schematically illustrating a measurement apparatus provided in a substrate processing apparatus, according to an embodiment.

FIG. 5 is a side view schematically illustrating a measurement apparatus provided in a substrate processing apparatus, according to an embodiment.

Referring to FIG. 5, a measurement apparatus 60 may include an analysis unit 61 and a determination unit 62. As described above, the measurement apparatus 60 may be an optical measurement apparatus, and may determine, for example, whether or not a label material is detected, by analyzing a wavelength of the label material. In an embodiment, the measurement apparatus 60 may be an OES. In an embodiment, the analysis unit 61 may receive light and analyze a wavelength of the light, and the determination unit 62 may receive wavelength data analyzed by the analysis unit 61 and determine whether or not light in a particular wavelength band is detected. The determination unit 62 may be implemented, for example, as a processor. As described above, the label material includes a material that is different from a material used during a process, and thus, when the label material layer 50 is not exposed, only light in a wavelength band emitted by the material used during the process or by-products thereof is detected via the analysis unit 61. In this case, the determination unit 62 may determine that the label material is not detected. However, when the label material layer 50 is exposed by etching of the electrostatic chuck, light in a wavelength band that is not detected before, i.e., light in a wavelength band emitted by the label material, is detected via the analysis unit 61. In this case, the determination unit 62 may determine that the label material is detected. Whether or not to replace the supporting unit 20, i.e., the electrostatic chuck, may be determined according to whether or not the label material is detected. The detection of the label material indicates that the electrostatic chuck is used up to an electrostatic chuck maximum use depth, and thus, a point in time of replacement of the electrostatic chuck may be identified.

Figure 6:
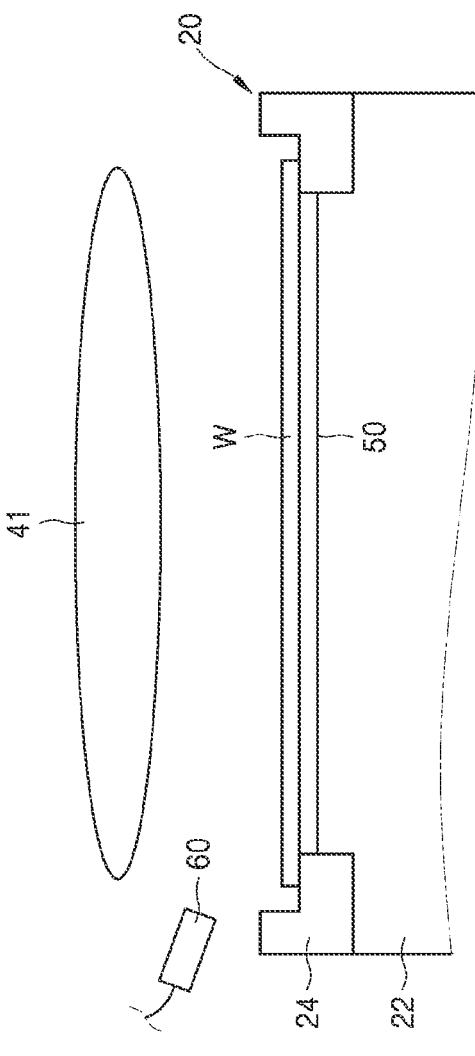
FIG. 6 is a cross-sectional view illustrating a process of processing a substrate in the substrate processing apparatus of FIG. 2, according to an embodiment.
Figure 7:
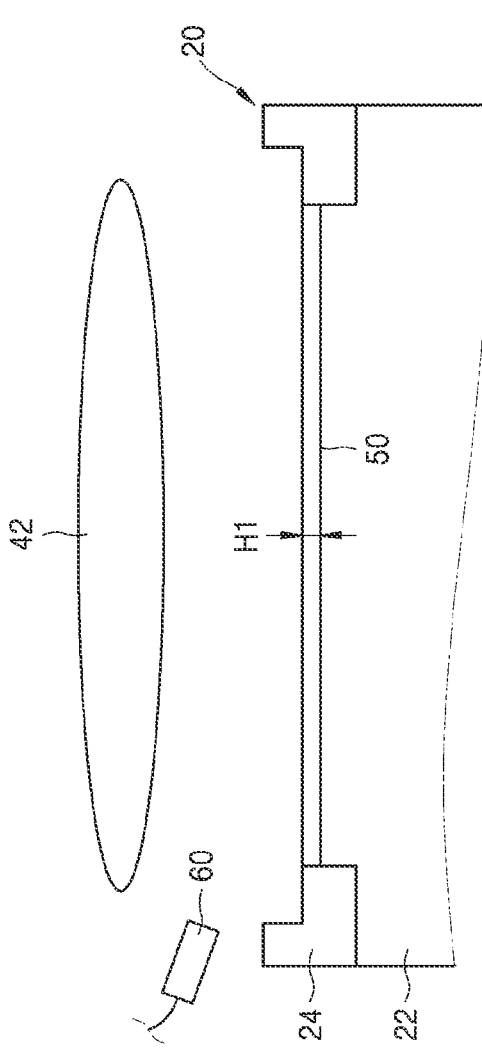
FIG. 7 to FIG. 9 are cross-sectional views illustrating a process of a supporting unit being etched in an operation of cleaning the supporting unit of the substrate processing apparatus of FIG. 2, according to an embodiment.
Figure 8:
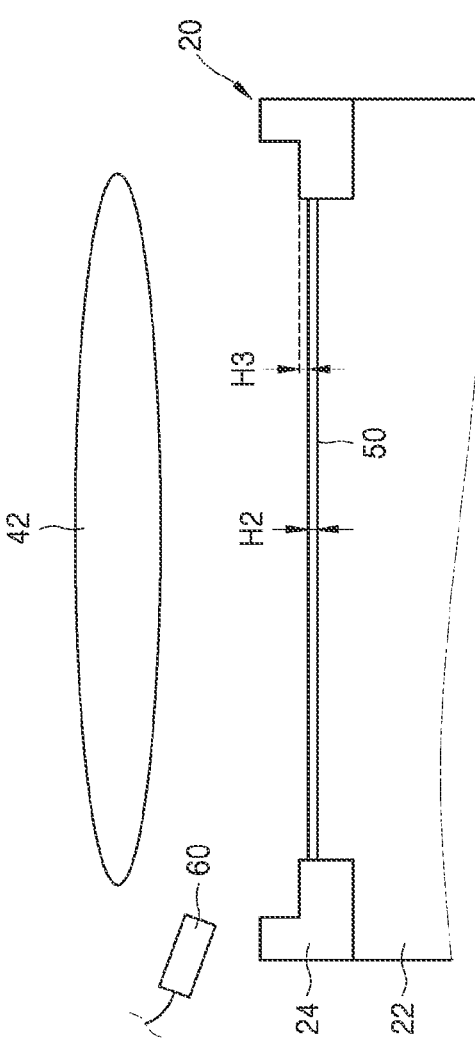
Figure 9:
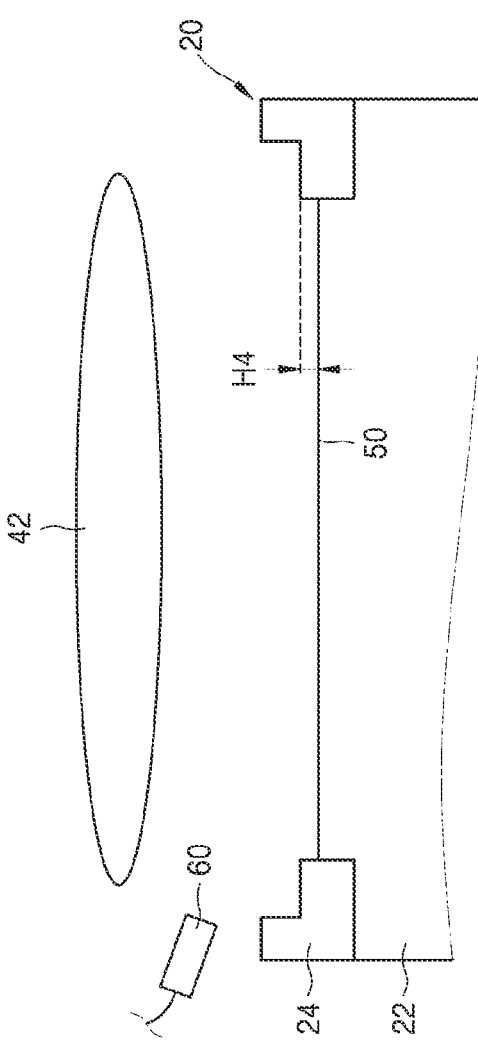

FIG. 6 is a cross-sectional view illustrating a process of processing a substrate in the substrate processing apparatus 2 of FIG. 2, according to an embodiment. FIG. 7 to FIG. 9 are cross-sectional views illustrating a process of a supporting unit being etched in an operation of cleaning the supporting unit of the substrate processing apparatus 2 of FIG. 2, according to an embodiment.

Referring to FIG. 6, a supporting unit 20 supports a substrate W. In one embodiment, the substrate W is located on a support plate 22. The supporting unit 20 may include an electrostatic chuck that adsorbs the substrate W by using an electrostatic force. The plasma source 40 of FIG. 2 may generate substrate processing process plasma 41 from a processing gas in the processing space 12 inside the chamber 10. In an embodiment, the processing gas may include an etching gas. For example, the etching gas may include a gas, such as $SF_6$ and/or $CF_4$. In an embodiment, the processing gas may be a deposition gas. For example, the processing gas may be a gas, such as $C_4F_8$ and/or $C_2F_4$. A substrate processing process is performed by using the substrate processing process plasma 41. After the substrate processing process is completed, the substrate W may be taken out from the processing space 12 through the substrate gateway 14.

Referring to FIGS. 7 to 9, when the substrate processing process is completed and thus the substrate W is taken out from a processing space, a cleaning process of a supporting unit 20 is performed. The plasma source 40 of FIG. 2 may generate cleaning plasma 42 from a processing gas in the processing space 12 inside the chamber 10. In one embodiment, the cleaning process of the supporting unit 20 may be a dry cleaning process or an ISD dry cleaning process, and the processing gas may be a gas for the dry cleaning process. For example, the processing gas may be a gas, such as $C_4H_6$, $C_4F_8$, $CH_2F_2$, and $O_2$. The cleaning process of the supporting unit 20 is performed by using the cleaning plasma 42. A cleaning process for removing impurities remaining on an edge portion of a support plate 22 or an upper portion of a focus ring 24 may be performed. In particular, a cleaning process of an electrostatic chuck may be performed. While the cleaning process of the electrostatic chuck is performed, a surface of the electrostatic chuck is exposed, and thus, etching of the electrostatic chuck may occur. The etching of the electrostatic chuck may occur by the cleaning plasma 42.

As illustrated in FIG. 7, when etching of the electrostatic chuck does not progress at all, a label material layer 50 is located from a top surface of the electrostatic chuck to an electrostatic chuck maximum usable depth H1. Subsequently, referring to FIG. 8, the electrostatic chuck is etched by a depth of H3, and the electrostatic chuck may be further used until the electrostatic chuck is etched by a depth of H2 at which the label material layer 50 will be exposed. Referring to FIG. 9, the electrostatic chuck is etched to the electrostatic chuck maximum usable depth H1, and thus, the label material layer 50 is exposed, and a depth H4 to which the electrostatic chuck is etched to this point may correspond to the electrostatic chuck maximum usable depth H1.

Figure 10:
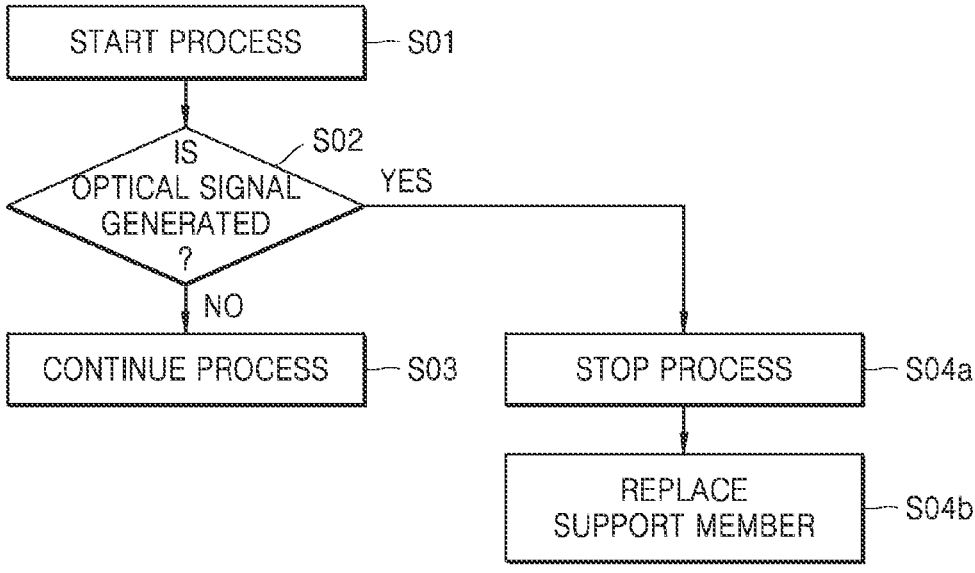
FIG. 10 is a flowchart illustrating a substrate processing method according to an embodiment.

FIG. 10 is a flowchart illustrating a substrate processing method according to an embodiment. Referring to FIG. 10, the substrate processing method may include process start operation S01, optical signal generation determination operation S02, and subsequent operations.

In process start operation S01, a process is performed. The process may include an etching process or a deposition process for processing the substrate W. Alternatively, the process may include a cleaning process for cleaning the supporting unit 20.

In optical signal generation determination operation S02, subsequent operations vary according to whether or not a condition for generating an optical signal is achieved. As described above, the measurement apparatus 60 may be an optical measurement apparatus, and may determine, for example, whether or not a label material is detected, by analyzing a wavelength of the label material. The analysis unit 61 may receive light and analyze a wavelength of the light, and the determination unit 62 may receive wavelength data analyzed by the analysis unit 61 and determine whether or not light in a particular wavelength band is detected. When the measurement apparatus 60 detects a wavelength emitted by the label material, the measurement apparatus 60 determines that an optical signal is generated. Alternatively, when determining that an intensity of the wavelength emitted by the label material exceeds a predetermined reference intensity, the measurement apparatus 60 may determine that the condition for generating the optical signal is achieved.

when the condition for generating the optical signal is not achieved in optical signal generation determination operation S02, process continuation operation S03, which is a subsequent operation, is performed. The performance of process continuation operation S03 indicates that the label material layer 50 is not yet exposed and the electrostatic chuck is not etched to an electrostatic chuck maximum usable depth. Therefore, the electrostatic chuck may be further used, and the process continues without replacement of the electrostatic chuck.

In contrast, when the condition for generating the optical signal is achieved in optical signal generation determination operation S02, the process is stopped in subsequent operation S04*a*, and the supporting unit 20 is replaced in operation S04*b*. When the measurement apparatus 60 determines that an optical signal is generated by detecting a wavelength emitted by the label material, the electrostatic chuck may be etched to the electrostatic chuck maximum usable depth and thus, may no longer be used. Accordingly, an operation of replacing the electrostatic chuck is performed. After the supporting unit 20 is replaced, subsequent processes may continue again.

Figure 11:
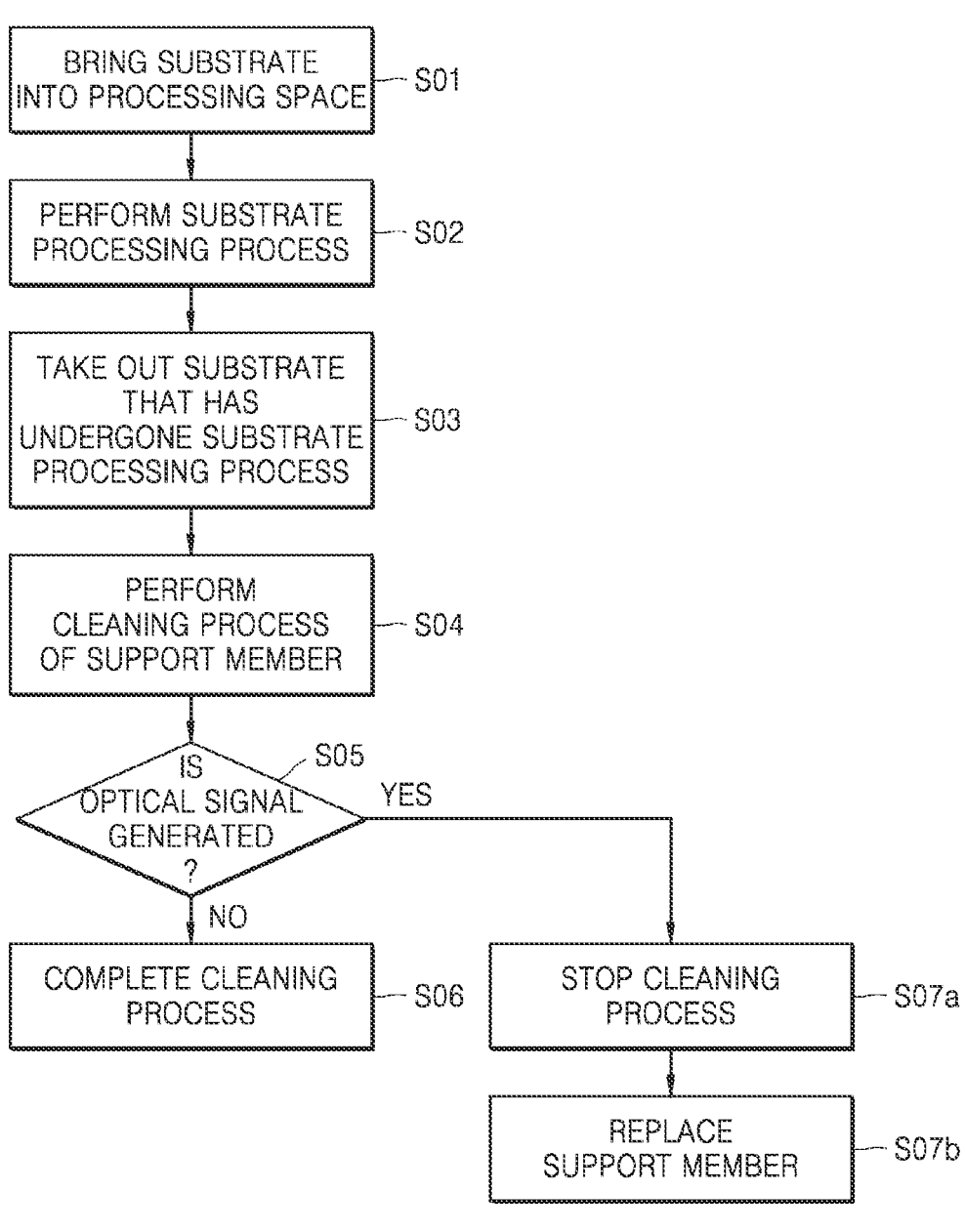
FIG. 11 is a flowchart illustrating a substrate processing method according to an embodiment.

FIG. 11 is a flowchart illustrating a substrate processing method according to an embodiment. Referring to FIG. 11, the substrate processing method may include operation S01 of bringing a substrate into a processing space, operation S02 of performing a substrate processing process, operation S03 of taking out the substrate that undergoes the substrate processing process, operation S04 of performing a cleaning process for a supporting unit, operation S05 of determining whether or not an optical signal is generated, and subsequent operations.

In operation S01 of bringing the substrate into the processing space, the substrate W may be brought into the processing space 12 inside the chamber unit 100 through the substrate gateway 14. In operation S02 of performing the substrate processing process, a process of processing the substrate W may be performed, and the process of processing the substrate W may include an etching process or a deposition process. The process of processing the substrate W may be performed by the substrate processing process plasma 41 that is formed from a processing gas by the plasma source 40. In operation S03 of taking out the substrate that undergoes the substrate processing process, the substrate W, which undergoes the process of processing the substrate W, for example, the etching process or the deposition process, may be taken out from the chamber unit 100 through the substrate gateway 14.

In operation S04 of performing the cleaning process of the supporting unit, the substrate W is taken out, and the cleaning process is performed while the supporting unit 20 is exposed. In an embodiment, the cleaning process of the supporting unit 20 may be an ISD dry cleaning process, and a processing gas may be a gas for the ISD dry cleaning process. In particular, a cleaning process of an electrostatic chuck may be performed.

In operation S05 of determining whether or not an optical signal is generated, subsequent operations vary according to whether or not a condition for generating an optical signal is achieved. As described above, the measurement apparatus 60 may be an optical measurement apparatus, and may determine, for example, whether or not a label material is detected, by analyzing a wavelength of the label material. The analysis unit 61 may receive light and analyze a wavelength of the light, and the determination unit 62 may receive wavelength data analyzed by the analysis unit 61 and determine whether or not light in a particular wavelength band is detected. When the measurement apparatus 60 detects a wavelength emitted by the label material, the measurement apparatus 60 determines that an optical signal is generated. Alternatively, when determining that an intensity of the wavelength emitted by the label material exceeds a predetermined reference intensity, the measurement apparatus 60 may determine that the condition for generating the optical signal is achieved.

when the condition for generating the optical signal is not achieved in operation S05 of determining whether or not the optical signal is generated, cleaning process completion operation S05, which is a subsequent operation, is performed. The performance of cleaning process completion operation S06 indicates that the label material layer 50 is not yet exposed and the electrostatic chuck is not etched to the electrostatic chuck maximum usable depth. Accordingly, the electrostatic chuck may be further used, and the process may continue without replacement of the electrostatic chuck to complete the cleaning process.

In contrast, when the condition for generating the optical signal is achieved in operation S05 of determining whether or not the optical signal is generated, a cleaning process is stopped in operation S07*a* which is a subsequent operation, and operation S07*b* of replacing the supporting unit 20 is performed. When the measurement apparatus 60 determines that an optical signal is generated by detecting a wavelength emitted by the label material, the electrostatic chuck may be etched to the electrostatic chuck maximum usable depth and thus, may no longer be used. Accordingly, an operation of replacing the electrostatic chuck is performed. After the supporting unit 20 is replaced, subsequent processes may continue again.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a chamber having a processing space therein;
a supporting unit arranged in the processing space, having a substrate located thereon, and including a label material layer including a label material therein;
a plasma source configured to generate plasma from a processing gas in the processing space; and
an optical measurement apparatus configured to detect exposure of the label material by analyzing a wavelength of the label material when the label material layer is exposed, wherein the label material emits a wavelength that is outside a wavelength of a band of the plasma or the processing gas,
wherein, the label material layer is exposed when the supporting unit is etched to a depth that is greater than or equal to a first depth, and
wherein the processing gas includes a gas for dry cleaning, and the label material includes at least one selected from the group consisting of Helium (He) and Neon (Ne).

2. The substrate processing apparatus of claim 1, wherein whether or not to replace the supporting unit is determined according to whether or not the measurement apparatus detects the label material.

3. The substrate processing apparatus of claim 1, wherein the supporting unit includes an electrostatic chuck.

4. The substrate processing apparatus of claim 1, wherein the label material includes a material that is different from the processing gas.

5. The substrate processing apparatus of claim 1, wherein the gas for dry cleaning includes at least one selected from the group consisting of $C4H_6$, $C4F_8$, $CH_2F_2$, and $O_2$.

6. The substrate processing apparatus of claim 1, wherein a wavelength emitted by the label material does not overlap a wavelength band emitted by the processing gas.

7. The substrate processing apparatus of claim 1, wherein the label material includes a material that does not react with the processing gas.

8. The substrate processing apparatus of claim 1, wherein the label material layer has a shape extending in parallel with a first surface of the supporting unit having the substrate located thereon.

9. The substrate processing apparatus of claim 1, wherein the supporting unit includes a plurality of cooling gas holes therein, and the plurality of cooling gas holes extend through the label material layer.

10. The substrate processing apparatus of claim 1, wherein the measuring apparatus includes:
an analysis unit configured to receive light and analyze a wavelength of the light; and
a determination unit configured to determine whether or not light in a particular wavelength band is detected from the wavelength analyzed by the analysis unit.

11. The substrate processing apparatus of claim 1, wherein the measurement apparatus includes an optical emission spectroscopy.

12. A substrate processing apparatus comprising:
a chamber having a processing space therein;
a supporting unit arranged in the processing space, supporting a substrate, and including a label material layer buried therein;
a plasma source configured to generate plasma from a processing gas in the processing space; and
an optical measurement apparatus configured to detect exposure of a label material by analyzing a wavelength of the label material when the label material is exposed,
wherein the label material layer is exposed by etching of the supporting unit,
wherein the label material emits a wavelength that is outside a wavelength of a band of the plasma or the processing gas,
wherein when the measurement apparatus detects the label material, a process is stopped, and the supporting unit is replaced, and
wherein the processing gas includes a gas for dry cleaning, and the label material includes at least one selected from the group consisting of Helium (He) and Neon (Ne).

13. The substrate processing apparatus of claim 12, wherein the supporting unit includes an electrostatic chuck.

14. The substrate processing apparatus of claim 12, wherein the measuring apparatus includes:
an analysis unit configured to receive light and analyze a wavelength of the light; and
a determination unit configured to determine whether or not light in a particular wavelength band is detected from the wavelength analyzed by the analysis unit.

* * * * *